United States Patent
Nagano et al.

(10) Patent No.: US 6,531,754 B1
(45) Date of Patent: Mar. 11, 2003

(54) MANUFACTURING METHOD OF PARTIAL SOI WAFER, SEMICONDUCTOR DEVICE USING THE PARTIAL SOI WAFER AND MANUFACTURING METHOD THEREOF

(75) Inventors: Hajime Nagano, Yokohama (JP); Takashi Yamada, Ebina (JP); Tsutomu Sato, Yokohama (JP); Ichiro Mizushima, Yokohama (JP); Osamu Fujii, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/083,131

(22) Filed: Feb. 27, 2002

(30) Foreign Application Priority Data

Dec. 28, 2001 (JP) ......................... 2001-401999

(51) Int. Cl.$^7$ .................. H01L 27/01; H01L 27/12; H01L 31/0392; H01L 29/00
(52) U.S. Cl. .............. 257/510; 257/349; 257/353; 257/354; 257/501; 257/506; 257/510
(58) Field of Search .................. 257/347–354, 257/506, 507, 510

(56) References Cited

U.S. PATENT DOCUMENTS 5,081,062 A * 1/1992 Vasudev et al. .......... 437/132
5,212,397 A * 5/1993 See et al. .................. 257/347
5,740,099 A * 4/1998 Tanigawa .................. 365/51
5,904,535 A * 5/1999 Lee .......................... 438/341
6,288,427 B2 * 9/2002 Huang ....................... 257/350

FOREIGN PATENT DOCUMENTS

| JP | 8-17694 | 1/1996 |
|----|---------|--------|
| JP | 11-17001 | 1/1999 |
| JP | 2000-243944 | 9/2000 |

OTHER PUBLICATIONS

Robert Hannon, et al. "0.25 $^M$m Merged Bulk DRAM and SOI Logic Using Patterned SOI," 2000 Symposium on VLSI Technology Digest of Technical Papers pp. 66–67, 2000.
H. L. Ho, et al. "A 0.13 $\mu$m High–Performance SOI Logic Technology with Embedded DRAM for System–On–A–Chip Application" IEDM Tech. Digest p. 503, 2001.

* cited by examiner

Primary Examiner—Eddie Lee
Assistant Examiner—Jesse A. Fenty
(74) Attorney, Agent, or Firm—Oblon, Spivak, McClelland, Maier & Neustadt, P.C.

(57) ABSTRACT

A semiconductor device includes a first semiconductor region having a buried oxide layer formed therein, a second semiconductor region in which the buried oxide layer does not exist, a trench formed to such a depth as to reach at least the buried oxide layer in a boundary portion between the first and second semiconductor regions, and an isolation insulating layer buried in the trench.

14 Claims, 11 Drawing Sheets

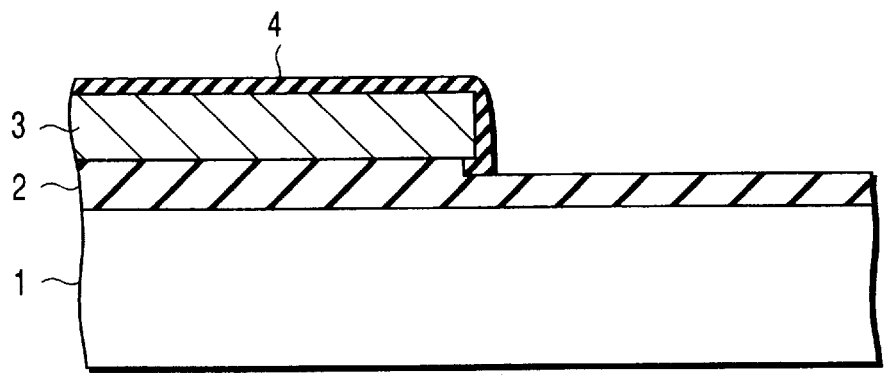
F I G. 6A
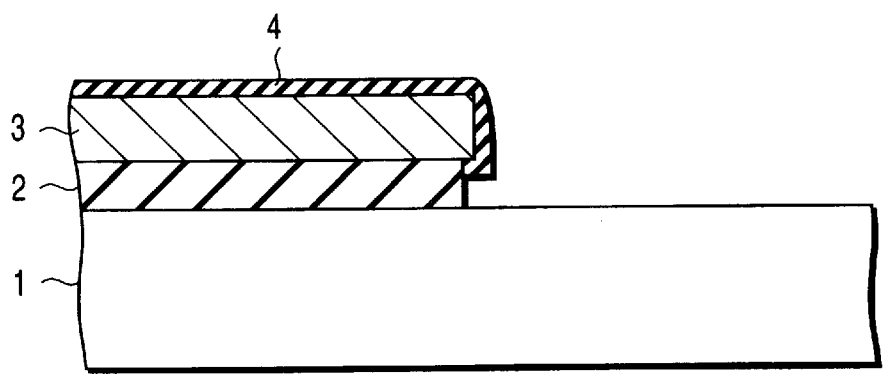
F I G. 6B
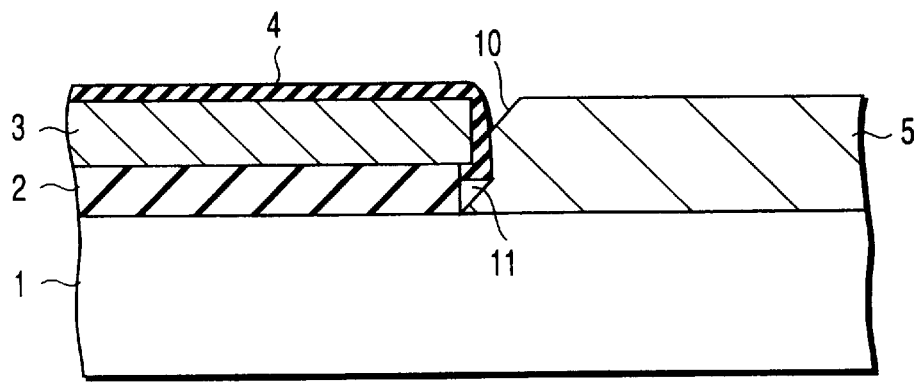
F I G. 6C

MANUFACTURING METHOD OF PARTIAL SOI WAFER, SEMICONDUCTOR DEVICE USING THE PARTIAL SOI WAFER AND MANUFACTURING METHOD THEREOF

CROSS-REFERENCE TO RELATED APPLICATIONS

This application is based upon and claims the benefit of priority from the prior Japanese Patent Application No. 2001-401999, filed Dec. 28, 2001, the entire contents of which are incorporated herein by reference.

BACKGROUND OF THE INVENTION

1. Field of the Invention

This invention relates to a manufacturing method of a partial SOI wafer, a semiconductor device using the partial SOI wafer and a manufacturing method thereof and more particularly to a manufacturing method of a partial SOI wafer having a non-SOI region formed therein by removing a BOX (Buried OXide) layer and silicon layer on a partial region of an SOI (Silicon On Insulator) substrate, a semiconductor device having elements formed in an SOI region and non-SOI region of the partial SOI wafer and a manufacturing method thereof.

2. Description of the Related Art

A DRAM including memory cells each having one MOSFET and one capacitor is suitable high density integration and is used in various applications as an inexpensive large-capacity memory. Particularly, in recent years, it is strongly required to develop a system LSI which is configured by integrating the DRAM and a logic circuit on a single semiconductor chip to enhance the system performance.

On the other hand, in order to enhance the performance of the logic circuit configured by mainly using MOSFETs, much attention is given to a structure in which MOSFETs are formed not in a silicon substrate, which is widely used in the prior art, but in a thin-film SOI substrate, and products are already available for some applications as high-performance logic devices.

Particularly, demand for a system LSI having the high-performance logic circuit and DRAM mounted thereon is strong and it is desired to develop the technique for forming the DRAM together with the logic circuit whose performance is enhanced by use of the SOI structure. In this trend, it is strongly required to develop a system LSI having a DRAM mounted on a high-performance logic chip configured by use of the SOI structure.

In order to meet the above requirement, it is considered that the above elements are selectively formed on an SOI wafer having an SOI region and a non-SOI region (a region formed by partially removing a BOX layer of the SOI substrate).

However, although a MOSFET formed on the SOI substrate has a bright future as a high-performance logic device, it is known that a parasitic MOSFET or parasitic bipolar transistor is operated depending on the source-drain voltage condition due to a so-called substrate-floating effect when gate voltage which turns OFF the MOSFET is applied and a leak current flows in the source-drain path. The above characteristic causes a problem of, for example, deterioration of retention for applications in which the specification for the leak current is strict, as in a memory cell transistor of a DRAM, for example, and is not preferable. Further, in the sense amplifier circuit of a DRAM, since the threshold voltages of the paired transistors are shifted due to the substrate-floating effect, the sense margin is lowered. Due to the above problems, it is difficult to form a DRAM with the same MOSFET structure as the high-performance logic circuit on the SOI substrate.

In order to completely cancel the substrate-floating effect, it is necessary to form a contact region and a lead-out region from the body section of each MOSFET and control the body potential. However, in order to meet the above requirement, the cell area and the area of the sense amplifier section are made extremely large, thereby losing the high integration density which is the best feature of a DRAM.

In order to solve the above problem, various methods for using a substrate (which is hereinafter referred to as a partial non-SOI wafer) obtained by forming a non-SOI region in an SOI substrate, forming a high-performance logic circuit on the SOI region and forming a circuit which is affected by the substrate-floating effect on the non-SOI region are proposed. The isolation technique by use of an STI (Shallow Trench Isolation) region for isolation between the SOI region and the non-SOI region of the partial SOI wafer is proposed with much attention paid to the depth of the BOX layer and the depth of the STI region (for example, Jpn. Pat. Appln. KOKAI Publication No. 08-17694), but a connection structure between the BOX layer and the STI region is not described.

The volume of an oxide existing on a chip formed by use of a silicon balk wafer is much smaller than the volume of silicon, since the oxide contains only a buried oxide in the STI region except the gate oxide film. On the other hand, the volume of oxide in the partial SOI wafer becomes equal to the volume thereof in the "BOX layer+STI region" and is much larger than the volume of the oxide in the bulk wafer. Therefore, the stress applied to the silicon layer becomes larger accordingly and crystal defects tend to occur in the non-SOI region. Further, since the STI region lies in the end portion of the oxide with the large volume, particularly, in a case where the BOX layer and STI region are continuously formed, crystal defects tend to occur in the non-SOI region and it is difficult to obtain a high-quality partial SOI wafer unless much attention is paid to the shape thereof.

As described above, with the conventional partial SOI wafer manufacturing method, crystal defects tend to occur in the non-SOI region and the quality thereof is lowered by concentration of the stress due to a difference in the volume of the oxide between the SOI region and the non-SOI region.

Further, in the conventional semiconductor device using the partial SOI wafer and the manufacturing method thereof, the integration density is lowered if an attempt is made to attain high speed operation and high performance.

BRIEF SUMMARY OF THE INVENTION

According to an aspect of the present invention, there is provided a semiconductor device comprising a first semiconductor region having a buried oxide layer formed therein, a second semiconductor region in which the buried oxide layer does not exist, a trench formed to such a depth as to reach at least the buried oxide layer in a boundary portion between the first and second semiconductor regions, and an insulating layer for isolation buried in the trench, wherein an angle made by the bottom surface of the insulating layer for isolation and the side surface of the second semiconductor region is an obtuse angle.

According to another aspect of the present invention, there is provided a semiconductor device comprising a first semiconductor region having a buried oxide layer formed therein, a second semiconductor region in which the buried oxide layer does not exist, a trench formed to such a depth as to reach at least the buried oxide layer in a boundary portion between the first and second semiconductor regions, and an insulating layer for isolation buried in the trench, wherein a portion near a contact portion of the bottom surface of the insulating layer for isolation with the second semiconductor region has a curved surface.

According to another aspect of the present invention, there is provided a partial SOI wafer manufacturing method comprising selectively removing part of a buried oxide layer and a first silicon layer on an SOI substrate having the first silicon layer formed on a semiconductor substrate with the buried oxide layer disposed therebetween, forming a protection film to cover a remaining portion of the first silicon layer, forming a second silicon layer by use of an epitaxial growth method on that part of the semiconductor substrate from which the first silicon layer and buried oxide layer are removed, forming a trench to reach at least the buried oxide layer in a boundary portion between the first and second silicon layers by anisotropic etching, and burying an isolation insulating material into the trench, wherein an angle made by the bottom surface of the trench with the side surface of the second silicon layer is an obtuse angle or a portion near a contact portion of the bottom surface of the trench with the second silicon layer has a curved surface.

According to another aspect of the present invention, there is provided a semiconductor device manufacturing method comprising selectively removing part of a buried oxide layer and a first silicon layer on an SOI substrate having the first silicon layer formed on a semiconductor substrate with the buried oxide layer disposed therebetween, forming a protection film to cover a remaining portion of the first silicon layer, forming a second silicon layer by use of an epitaxial growth method on that part of the semiconductor substrate from which the first silicon layer and buried oxide layer are removed, forming a trench to reach at least the buried oxide layer in a boundary portion between the first and second silicon layers, burying an isolation insulating material into the trench, and respectively forming first and second elements in the first and second silicon layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 6A to 6H are cross sectional views sequentially showing manufacturing steps in order, for illustrating a partial SOI wafer manufacturing method and a semiconductor device manufacturing method according to the third embodiment of this invention;

DETAILED DESCRIPTION OF THE INVENTION

First Embodiment

Figure 1A:
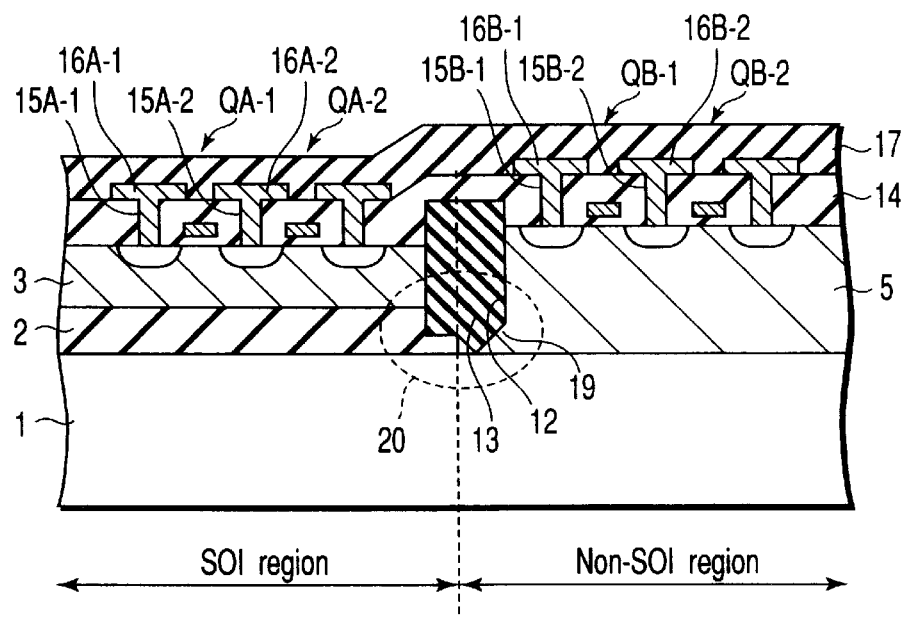
FIG. 1A is a cross sectional view showing an STI region in a boundary portion between an SOI region and a non-SOI region, for illustrating a semiconductor device according to a first embodiment of this invention.
Figure 1B:
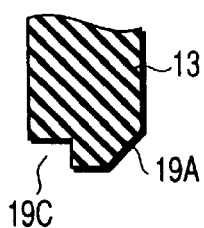
FIG. 1B is an enlarged view showing the lower portion of the STI region surrounded by broken lines in FIG. 1A.
Figure 1C:
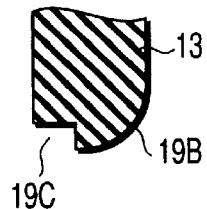
FIG. 1C is an enlarged view showing another example of the lower portion of the STI region surrounded by broken lines in FIG. 1A.

FIG. 1A is a cross sectional view showing an STI region in a boundary portion between an SOI region and a non-SOI region, for illustrating a semiconductor device according to a first embodiment of this invention and FIGS. 1B and 1C are enlarged views each showing the lower portion of the STI region surrounded by broken lines 20 in FIG. 1A.

On a silicon substrate 1 in the SOI region, a buried oxide layer (BOX layer) 2 is formed and a silicon layer 3 is formed on the BOX layer 2. Further, on the silicon substrate 1 in the non-SOI region (or bulk region), an epitaxial silicon layer 5 is formed. An element isolation trench 12 is formed in a boundary portion between the SOI region and the non-SOI region to such a depth as to reach the silicon substrate 1 and an insulating layer for isolation (STI element isolation film) 13 is buried in the trench 12. The bottom surface of the isolation insulating layer 13 is formed in contact with the silicon substrate 1, and as shown in FIG. 1B, an angle made by the bottom surface of the isolation insulating layer 13 and the side surface of the epitaxial silicon layer 5 is an obtuse angle (19A) by the presence of a facet 19 formed on that part of the epitaxial silicon layer 5 which lies near the isolation insulating layer 13. Alternatively, as shown in FIG. 1C, a portion near the contact portion of the bottom surface of the isolation insulating layer 13 with the epitaxial silicon layer 5 has a curved surface 19B. In this case, a portion of the isolation insulating layer 13 which lies on the BOX layer 2 side is engaged with the projecting portion of the lower portion of the BOX layer 2 and formed with an acute angle (19C).

For example, MOSFETs QA-1, QA-2, . . . configuring a logic circuit are formed in the silicon layer 3 and elements such as MOSFETs QB-1, QB-2, . . . configuring memory cells and sense amplifier circuit of a DRAM are formed in the epitaxial silicon layer 5. An inter-level insulating film 14 is formed on the silicon layer 3, epitaxial silicon layer 5 and isolation insulating layer 13. Contact holes 15A-1, 15A-2, . . . , 15B-1, 15B-2, . . . are formed in corresponding positions of the inter-level insulating film 14 which lie on the source and drain regions of the MOSFETs QA-1, QA-2, . . . , QB-1, QB-2, . . . . Further, interconnection layers 16A-1, 16A-2, . . . , 16B-1, 16B-2, . . . are formed on the inter-level insulating film 14 and connected to the respective source and drain regions of the MOSFETs QA-1, QA-2, . . . , QB-1, QB-2, . . . via the contact holes 15A-1, 15A-2, . . . , 15B-1, 15B-2, . . . . A surface protection film 17 is formed on the interconnection layers 16A-1, 16A-2, . . . , 16B-1, 16B-2, . . . and inter-level insulating film 14.

With the above structure, occurrence of crystal defects in the epitaxial silicon layer 5 due to concentration of the stress on the boundary portion between the oxide film and silicon can be suppressed. The reason for this is that an obtuse angle is made by the bottom surface of the isolation insulating layer 13 with the side surface of the non-SOI region as shown in FIG. 1B or the bottom surface of the isolation insulating layer 13 is formed in smooth contact with the epitaxial silicon layer 5 to provide a curved surface as shown in FIG. 1C. That is, there occurs no problem in an element isolation region formed in the wafer having only the SOI region or non-SOI region, but even if a wafer having a boundary between the SOI region and the non-SOI region is used, occurrence of a problem that crystal defects will occur in the wafer can be suppressed. This is because the volume of the oxide in the SOI region is larger than that in the non-SOI region and concentration of the stress can be suppressed by the smooth contact portion (19A or 19B) even if the stress applied to the epitaxial silicon layer 5 is large. The right-angled portion (acute angle portion) 19C is formed in the SOI region, but even if crystal defects occur from the right-angled portion 19C as an origin, no influence is given to the elements on the SOI region or non-SOI region as far as the defects extend into the silicon substrate 1 of the SOI region and, therefore, there occurs no problem.

Further, since it is not necessary to form a contact region and a lead-out region from the body section of each MOSFET for controlling the body potential, the cell area and the area of the sense amplifier section will not increase. Therefore, a high speed and high performance semiconductor device can be formed without losing the feature of high integration density when the partial SOI wafer is used.

Next, a manufacturing method of the partial SOI wafer and semiconductor device shown in FIG. 1A is explained with reference to FIGS. 2A to 2G.

First, an oxide layer 2 which will be used as a BOX layer is formed on a silicon substrate 1 and a silicon layer 3 is formed on the oxide layer 2 to form an SOI wafer. Alternatively, the silicon layer 1, BOX layer 2 and silicon layer 3 are stacked by use of a lamination method to form an SOI wafer.

Figure 2A:
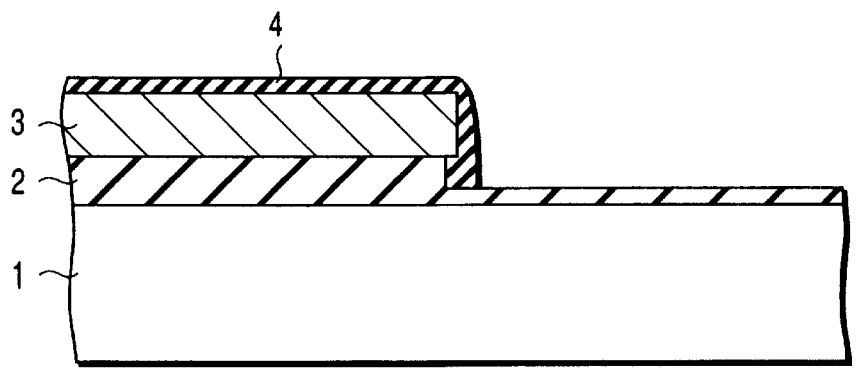
FIGS. 2A to 2G are cross sectional views sequentially showing manufacturing steps in order, for illustrating a partial SOI wafer manufacturing method and a semiconductor device manufacturing method according to the first embodiment of this invention.

Then, as shown in FIG. 2A, after part of the silicon layer 3 on the SOI wafer which is formed in the non-SOI region is removed by anisotropic etching such as RIE, part of the BOX layer 2 is removed by isotropic etching by use of a solution. In this case, anisotropic etching such as RIE can be used instead of isotropic etching to remove part of the BOX layer 2.

After this, a silicon nitride layer used as a protection film 4 is formed to cover the silicon layer 3. In this example, the silicon nitride layer is used as the protection film 4, but a silicon oxide layer can be used in the same manner.

Figure 2B:
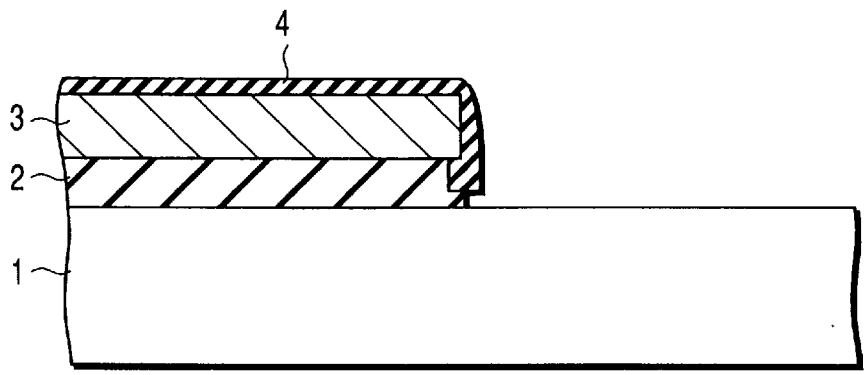

Next, part of the BOX layer 2 which remains on the non-SOI region is etched and removed (refer to FIG. 2B). As the etching process, wet etching using a solution is used instead of etching using ions. By use of the wet etching, occurrence of damage on the surface of the silicon substrate 1 in the non-SOI region caused by application of ions can be prevented.

Figure 2C:
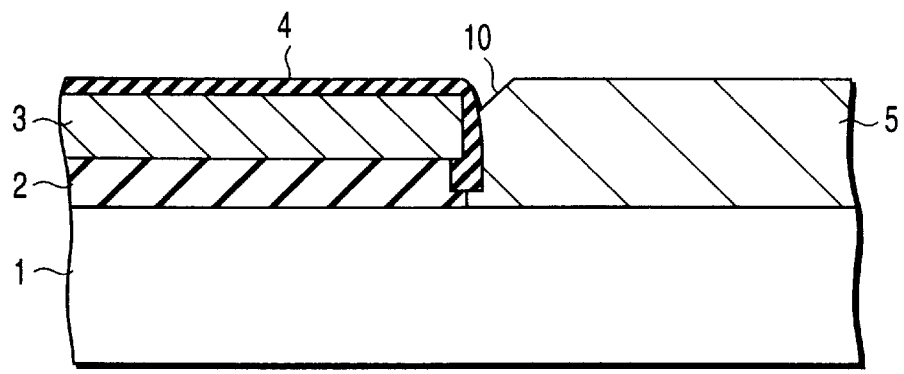

Then, as shown in FIG. 2C, an epitaxial silicon layer 5 is formed on the silicon substrate 1 in the non-SOI region. Since the protection film 4 is formed on the SOI region, the epitaxial silicon layer 5 is not formed thereon. At this time, the epitaxial growth is performed in a condition that a facet 10 is formed on a portion near the boundary of the surface region of the epitaxial silicon layer 5 with the SOI region. For example, the facet 10 can be formed by growing the epitaxial silicon layer 5 at 10 Torr. Further, the height of the surface of the epitaxial silicon layer 5 can be set to the same height as or a different height from the surface of the SOI region and freely adjusted by adjusting the time of the epitaxial growth. The height of the epitaxial silicon layer 5 can be freely set as required.

Figure 2D:
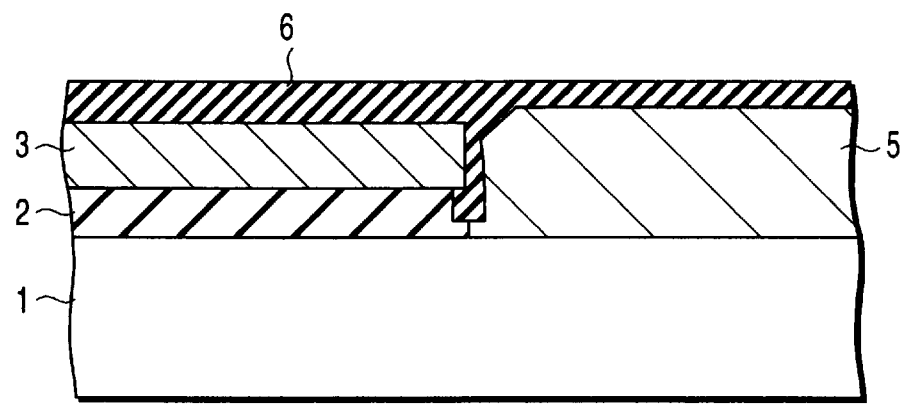
Figure 2E:
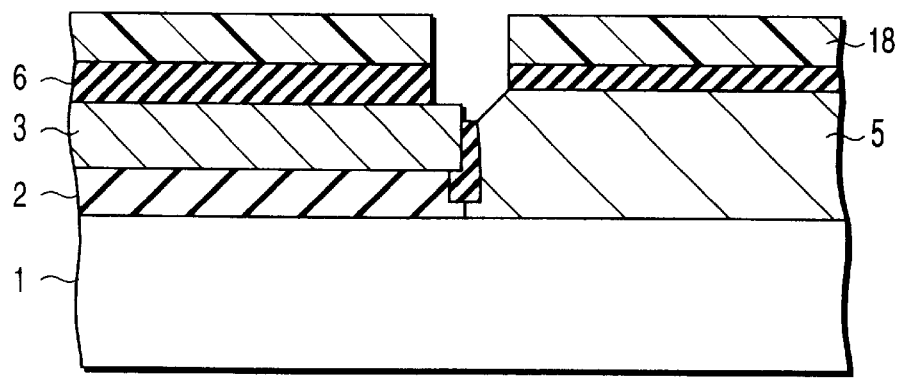

After this, as shown in FIG. 2D, a mask member 6 is deposited and formed on the protection film 4 and epitaxial silicon layer 5. In the present embodiment, a silicon nitride layer is used as the mask member 6 and represented integrally with the protection film 4.

Next, a region other than a region which configures the STI region is covered with a photomask 18 and part of the silicon nitride layer 6 used as the mask member 6 is removed. At this time, the silicon nitride layer 6 is overetched to expose the facet 10 of the epitaxial silicon layer 5 (refer to FIG. 2E).

Figure 2F:
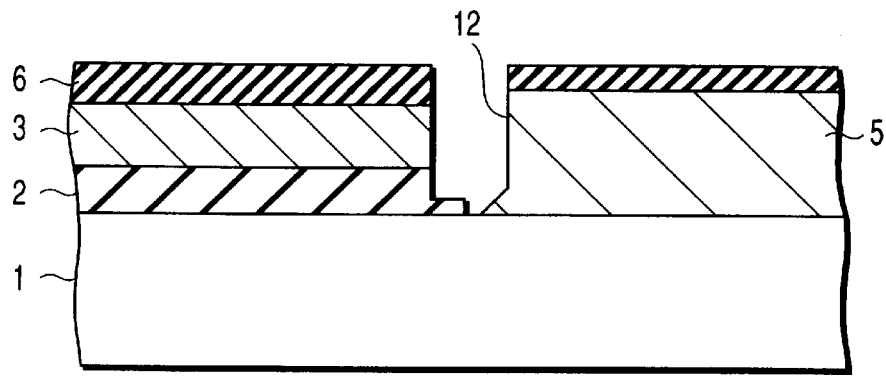

Then, as shown in FIG. 2F, portions of the protection film 4 (SiN), silicon layer 3, epitaxial silicon layer 5 (Si) and BOX layer 2 (SiO$_2$) which lie near the boundary portion between the SOI region and the non-SOI region are dry-etched by a method such as RIE in order to form an element isolation trench 12. In the above etching process, the condition in which SiN, SiO$_2$ and Si can be etched at substantially the same etching rate is used. The depth of the trench 12 will vary with the etching time, but in any depth, it is possible to form the trench 12 in which the bottom surface thereof is coupled with the side surface thereof at an angle of 90° or more (obtuse angle) at least on the non-SOI region side of the trench 12 by the presence of the facet 10. Depending on the etching condition, a portion near the contact portion of the bottom surface of the trench 12 with the non-SOI region may be formed to have a curved surface. It is sufficient if the trench 12 is formed to such a depth as to reach at least the BOX layer 2 and the trench can be formed to extend into the silicon substrate 1.

Figure 2G:
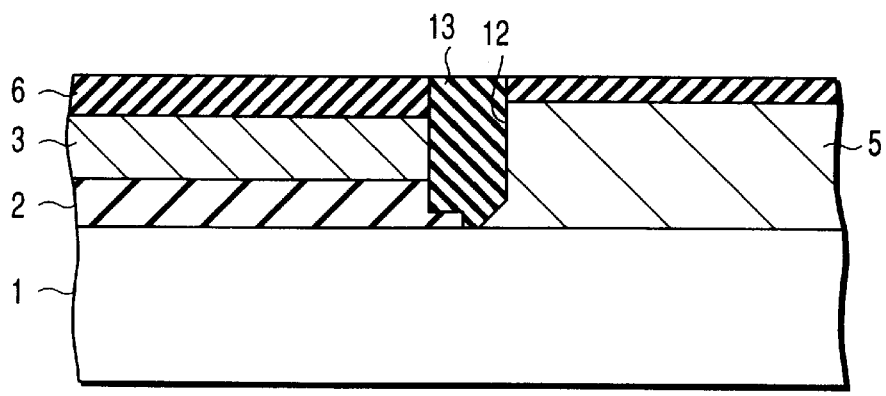

Next, as shown in FIG. 2G, an isolation insulating layer 13 is filled or buried in the trench 12 to form an element isolation region of STI structure.

After this, the mask member (silicon nitride layer) 6 on the silicon layer 3 and epitaxial silicon layer 5 is removed, and MOSFETs QA-1, QA-2, . . . configuring a logic circuit are formed in the silicon layer 3 and elements such as MOSFETs QB-1, QB-2, . . . configuring memory cells and sense amplifier circuit of a DRAM are formed in the epitaxial silicon layer 5 by use of a known process so as to form a semiconductor device as shown in FIG. 1A.

In this case, the MOSFETs QA-l, QA-2, . . . and MOSFETs QB-1, QB-2, . . . can be formed in different steps or can be formed by commonly using part or all of the steps.

According to the above manufacturing method, since the lower end portion of the STI element isolation film 13 can be formed in smooth contact with the epitaxial silicon layer 5 by use of the facet 10, entrance of is crystal defects into the epitaxial silicon layer 5 by concentration of the stress on the boundary portion between the oxide film and silicon can be suppressed. As a result, since crystal defects are difficult to enter the non-SOI region, a partial S01 wafer of high quality can be provided. Further, since it is not necessary to form a contact region and a lead-out region from the body section of each MOSFET for controlling the body potential, the cell area and the area of the sense amplifier section will not increase. Therefore, a high speed and high performance semiconductor device and a manufacturing method thereof can be attained without losing the feature of high integration density when the partial SOI wafer is used.

Second Embodiment

Figure 3A:
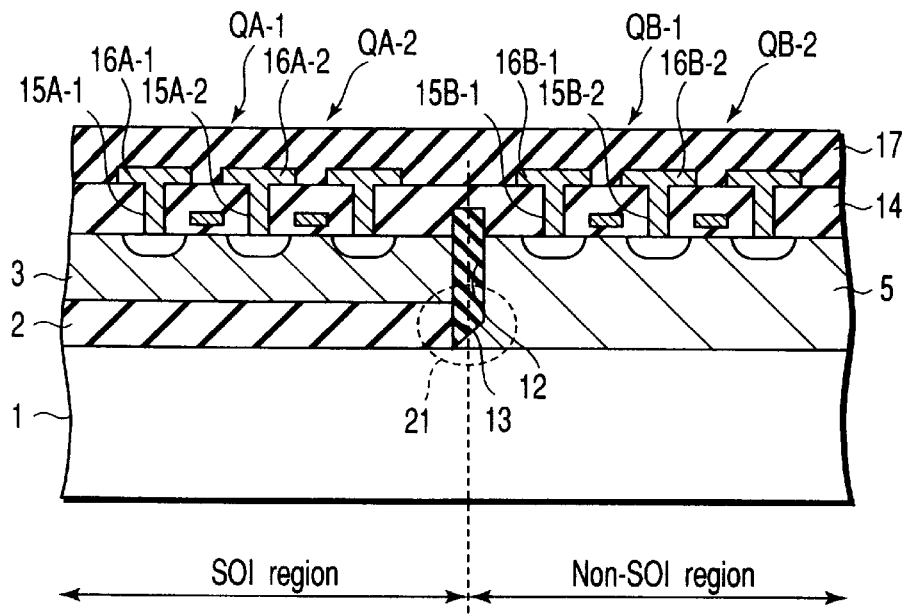
FIG. 3A is a cross sectional view showing an STI region in a boundary portion between an SOI region and a non-SOI region, for illustrating a semiconductor device according to a second embodiment of this invention.
Figure 3B:
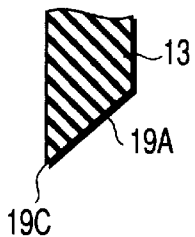
FIG. 3B is an enlarged view showing the lower portion of the STI region surrounded by broken lines in FIG. 3A.
Figure 3C:
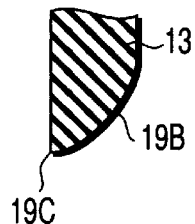
FIG. 3C is an enlarged view showing another example of the lower portion of the STI region surrounded by broken lines in FIG. 3A.

FIG. 3A is a cross sectional view showing an STI region in a boundary portion between an SOI region and a non-SOI region, for illustrating a semiconductor device according to a second embodiment of this invention and FIGS. 3B and 3C are enlarged views showing the lower portion of the STI region surrounded by broken lines 21 in FIG. 3A.

The semiconductor device according to the second embodiment has basically the same configuration as the first embodiment, the same reference numerals are attached to portions similar to those of FIG. 1A and the detail explanation thereof is omitted.

In the semiconductor device according to the second embodiment, like the first embodiment, a silicon layer and BOX layer are partly removed when a non-SOI region is formed and silicon is epitaxially grown on the non-SOI region of the silicon substrate. At this time, a cavity is formed in a boundary portion between the epitaxial silicon layer and the SOI region. Then, as shown in FIG. 3B, an obtuse angle 19A is made by the bottom surface of the isolation insulating layer 13 with the side surface of the epitaxial silicon layer 5 by use of the cavity, or as shown in FIG. 3C, a portion near the contact portion of the bottom surface of the isolation insulating layer 13 with the epitaxial silicon layer 5 is smoothly formed to have a curved surface 19B.

That is, an oxide layer 2 used as the BOX layer is formed on the silicon substrate 1 and a silicon layer 3 is formed on the oxide layer 2 to form an SOI wafer. Alternatively, the silicon layer 1, BOX layer 2 and silicon layer 3 are stacked by use of a lamination method to form an SOI wafer.

Figure 4A:
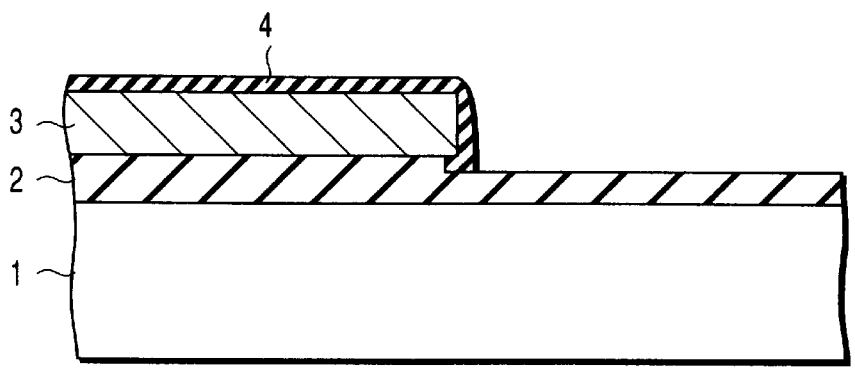
FIGS. 4A to 4H are cross sectional views sequentially showing manufacturing steps in order, for illustrating a partial SOI wafer manufacturing method and a semiconductor device manufacturing method according to the second embodiment of this invention.

Then, as shown in FIG. 4A, after part of the silicon layer 3 on the SOI wafer which is formed in the non-SOI region is removed by anisotropic etching such as RIE, part of the BOX layer 2 is removed by isotropic etching by use of a solution. Of course, in this case, anisotropic etching such as RIE can be used instead of isotropic etching to remove part of the BOX layer 2.

After this, a protection film 4 formed of silicon nitride or the like is formed to cover the silicon layer 3. In this example, silicon nitride is used to form the protection film 4, but silicon oxide can be used in the same manner.

Figure 4B:
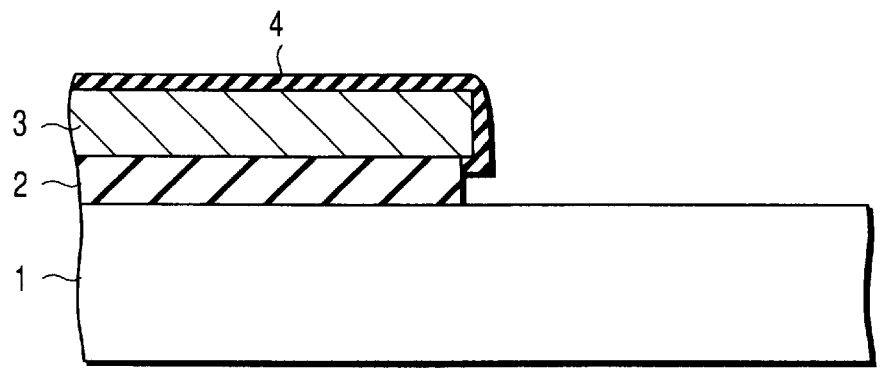

Next, part of the BOX layer 2 which remains on the non-SOI region is etched and removed (refer to FIG. 4B). As the etching process, wet etching using a solution is used instead of etching using ions. By use of the wet etching, occurrence of damage on the surface of the silicon substrate 1 in the non-SOI region caused by application of ions can be prevented. Further, the etching time is made longer than in the first embodiment so that the etching process may proceed in the lateral direction.

Figure 4C:
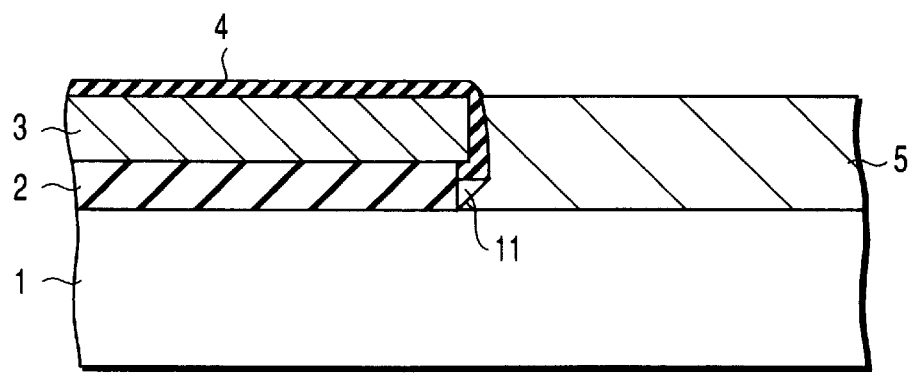

Then, as shown in FIG. 4C, an epitaxial silicon layer 5 is formed on the silicon substrate 1 in the non-SOI region. Since the protection film 4 is formed on the SOI region, the epitaxial silicon layer 5 is not formed thereon. At this time, a facet is formed on a portion near the boundary of the surface region of the epitaxial silicon layer 5 with the SOI region, and a facet portion which is formed on the inner side of the side wall of the protection film 4 remains as a cavity 11. Of course, like the first embodiment, the height of the surface of the epitaxial silicon layer 5 can be set to the same height as or a different height from the surface of the SOI region and freely adjusted by adjusting the time of the epitaxial growth. Therefore, the height of the epitaxial silicon layer 5 can be freely set as required.

Figure 4D:
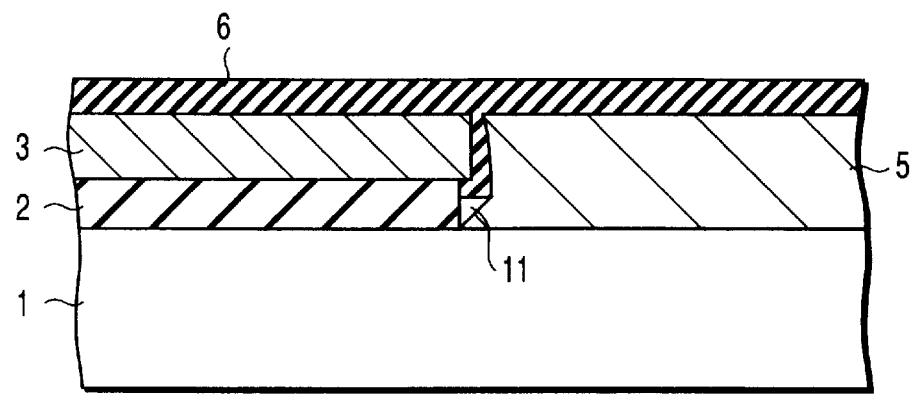

After this, as shown in FIG. 4D, a mask member 6 is deposited and formed on the protection film 4 and epitaxial silicon layer 5. In the present embodiment, a silicon nitride layer is used as the mask member 6 and represented integrally with the protection film 4.

Figure 4E:
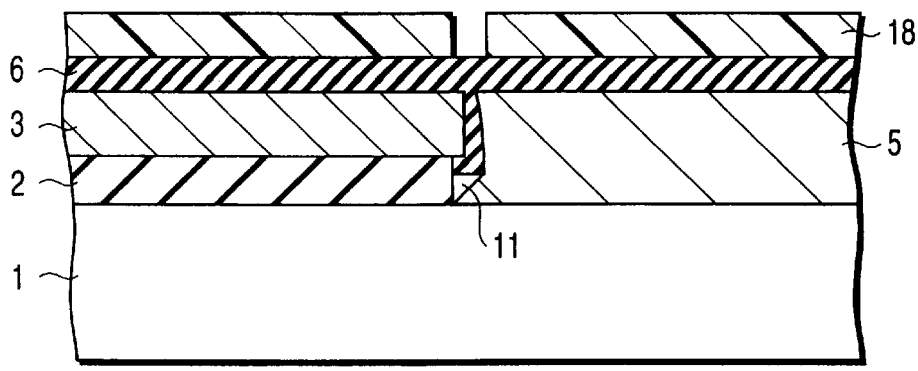
Figure 4F:
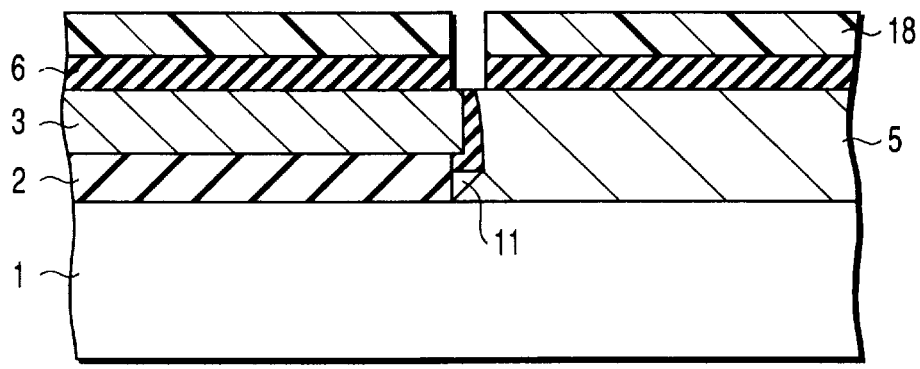

Next, a region other than a region which configures the STI region is covered with a photomask 18 (refer to FIG. 4E) and part of the silicon nitride layer used as the mask member 6 is removed (refer to FIG. 4F).

Figure 4G:
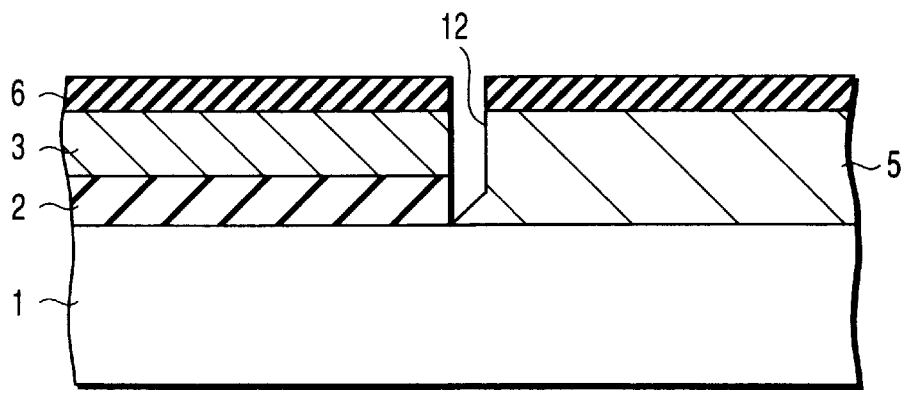

Then, as shown in FIG. 4G, portions of the protection film 4 (SiN), silicon layer 3, epitaxial silicon layer 5 (Si) and BOX layer 2 (SiO$_2$) which lie near the boundary portion between the SOI region and the non-SOI region are dry-etched by a method such as RIE in order to form an element isolation trench 12. In the above etching process, the condition in which SiN, SiO$_2$ and Si can be etched at substantially the same etching rate is used. The depth of the trench 12 will vary with the etching time, but in any depth, it is possible to form the trench 12 in which the bottom surface thereof is coupled with the side surface thereof at an angle of 90° or more (obtuse angle 19A) at least on the non-SOI region side of the trench 12 by the presence of the cavity 11. Depending on the etching condition, a portion near the coupling portion of the bottom surface of the trench 12 on the non-SOI region side is formed to have a curved surface 19B. It is sufficient if the trench 12 is formed to such a depth as to reach at least the BOX layer 2 and the trench can be formed to extend into the silicon substrate 1.

Figure 4H:
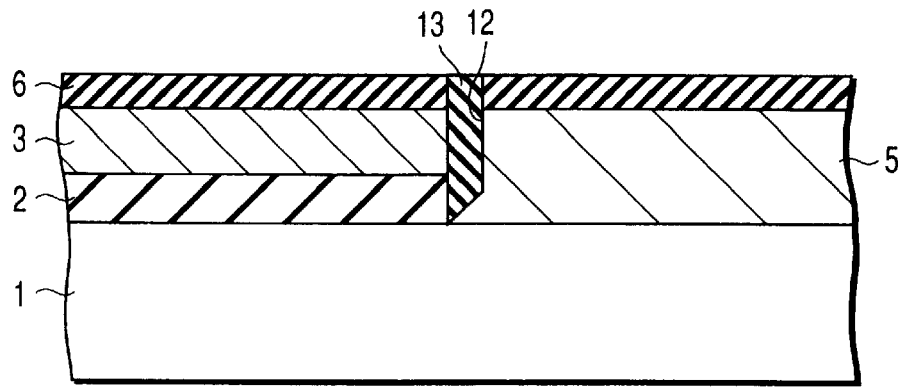

Next, as shown in FIG. 4H, an insulating layer for isolation 13 is filled or buried in the trench 12 to form an element isolation region of STI structure.

After this, the mask member 6 on the silicon layer 3 and epitaxial silicon layer 5 is removed, and MOSFETs QA-1, QA-2, . . . configuring a logic circuit are formed in the silicon layer 3 and elements such as MOSFETs QB-1, QB-2, . . . configuring memory cells and sense amplifier circuit of a DRAM are formed in the epitaxial silicon layer 5 by use of a known process so as to form a semiconductor device as shown in FIG. 3A.

In this case, the MOSFETs QA-1, QA-2, . . . and MOSFETs QB-1, QB-2, . . . can be formed in different steps or can be formed by commonly using part or all of the steps.

According to the above manufacturing method, since the lower end portion of the STI element isolation film 13 can be formed in smooth contact with the epitaxial silicon layer 5 by use of the cavity 11, entrance of crystal defects into the epitaxial silicon layer 5 by concentration of the stress in the boundary portion between the oxide film and silicon can be suppressed. As a result, since crystal defects are difficult to enter the non-SOI region, a partial SOI wafer of high quality can be provided. Further, since it is not necessary to form a contact region and a lead-out region from the body section of each MOSFET for controlling the body potential, the cell area and the area of the sense amplifier section will not increase. Therefore, a high speed and high performance semiconductor device and a manufacturing method thereof can be attained without losing the feature of high integration density when the partial SOI wafer is used.

Third Embodiment

Figure 5A:
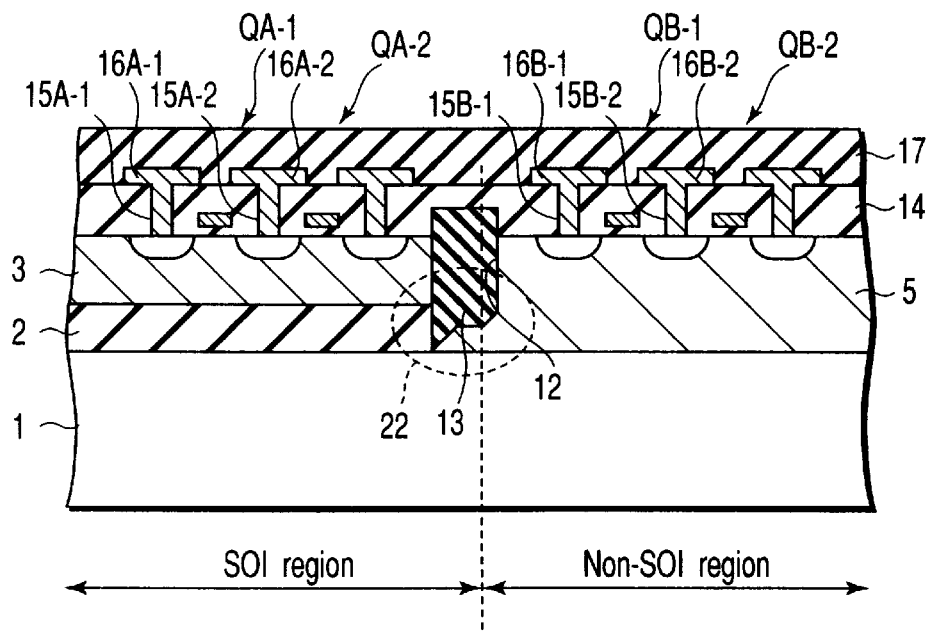
FIG. 5A is a cross sectional view showing an STI region in a boundary portion between an SOI region and a non-SOI region, for illustrating a semiconductor device according to a third embodiment of this invention.
Figure 5B:
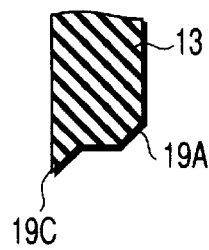
FIG. 5B is an enlarged view showing the lower portion of the STI region surrounded by broken lines in FIG. 3A.
Figure 5C:
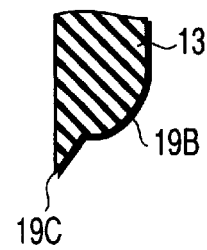
FIG. 5C is an enlarged view showing another example of the lower portion of the STI region surrounded by broken lines in FIG. 3A.

FIG. 5A is a cross sectional view showing an STI region in a boundary portion between an SOI region and a non-SOI region, for illustrating a semiconductor device according to a third embodiment of this invention and FIGS. 5B and 5C are enlarged views showing the lower portion of the STI region surrounded by broken lines 22 in FIG. 5A.

The semiconductor device according to the third embodiment has basically the same configuration as the first and second embodiments, the same reference numerals are attached to portions similar to those of FIG. 1A or FIG. 3A and the detail explanation thereof is omitted.

The semiconductor device according to the third embodiment is configured by combining the first and second embodiments, and in the semiconductor device, a silicon layer and BOX layer are partially removed when a non-SOI region is formed and then silicon is epitaxially grown on the non-SOI region of the silicon substrate. At this time, a facet and cavity are formed in a boundary portion between the epitaxial silicon layer and an SOI region. Then, as shown in FIG. 5B, an obtuse angle 19A is made by the bottom surface of an isolation insulating layer 13 and the side surface of the epitaxial silicon layer 5, or as shown in FIG. 5C, a portion near the contact portion of the bottom surface of the isolation insulating layer 13 with the epitaxial silicon layer 5 is smoothly formed to have a curved surface 19B by use of the facet and cavity.

That is, an oxide layer 2 used as the BOX layer is formed on the silicon substrate 1 and a silicon layer 3 is formed on the oxide layer 2 to form an SOI wafer. Alternatively, the silicon layer 1, BOX layer 2 and silicon layer 3 are stacked by use of a lamination method to form an SOI wafer.

Then, as shown in FIG. 6A, after part of the silicon layer 3 on the SOI wafer which is formed in the non-SOI region is removed by anisotropic etching such as RIE, part of the BOX layer 2 is removed by isotropic etching by use of a solution. In this case, anisotropic etching such as RIE can be used instead of isotropic etching to remove part of the BOX layer 2.

After this, a protection film 4 formed of silicon nitride or the like is formed to cover the silicon layer 3. In this example, silicon nitride is used to form the protection film 4, but silicon oxide can be used in the same manner.

Next, part of the BOX layer 2 which remains on the non-SOI region is removed by etching (refer to FIG. 6B). As the etching process, wet etching using a solution is used instead of etching using ions. By use of the wet etching, occurrence of damage on the surface of the silicon substrate 1 in the non-SOI region caused by application of ions can be prevented. Further, like the second embodiment, the etching time is made longer than in the first embodiment so that the etching process may proceed in the lateral direction.

Then, as shown in FIG. 6C, an epitaxial silicon layer 5 is formed on the silicon substrate 1 in the non-SOI region. Since the protection film 4 is formed on the SOI region, the epitaxial silicon layer 5 is not formed thereon. At this time, a facet 10 is formed on a portion near the boundary of the surface region of the epitaxial silicon layer 5 with the SOI region. Further, a facet portion which is formed on the inner side of the side wall of the protection film 4 remains as a cavity 11. Of course, like the first and second embodiments, the height of the surface of the epitaxial silicon layer 5 can be set to the same height as or a different height from the surface of the SOI region and freely adjusted by adjusting the time of the epitaxial growth. Therefore, the height of the epitaxial silicon layer 5 can be freely set as required.

Figure 6D:
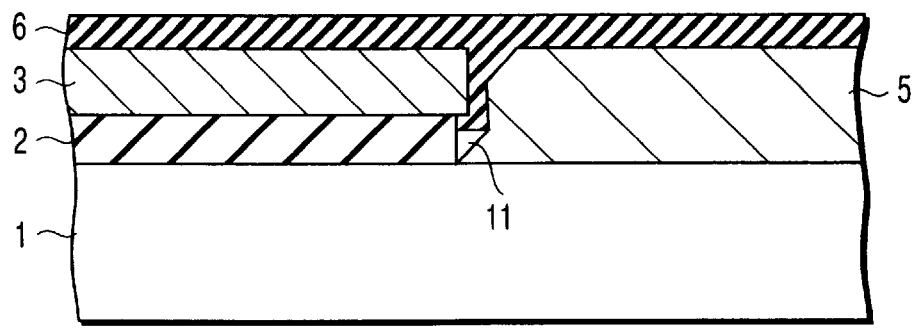

After this, as shown in FIG. 6D, a mask member 6 is deposited and formed on the protection film 4 and epitaxial silicon layer 5. In the present embodiment, a silicon nitride layer is used as the mask member 6 and represented integrally with the protection film 4.

Figure 6E:
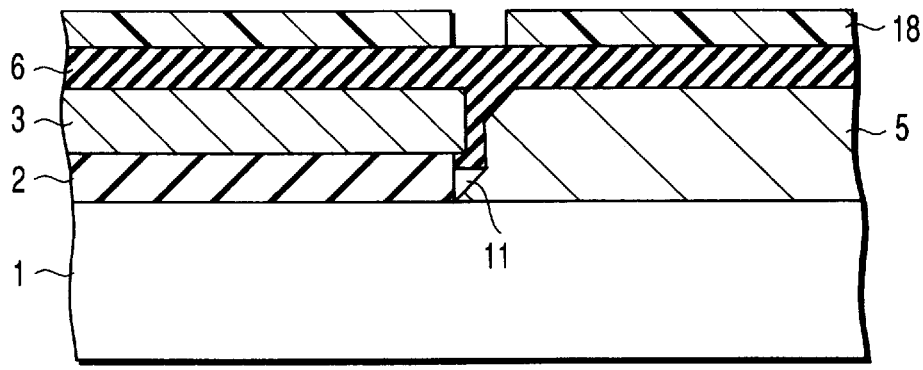
Figure 6F:
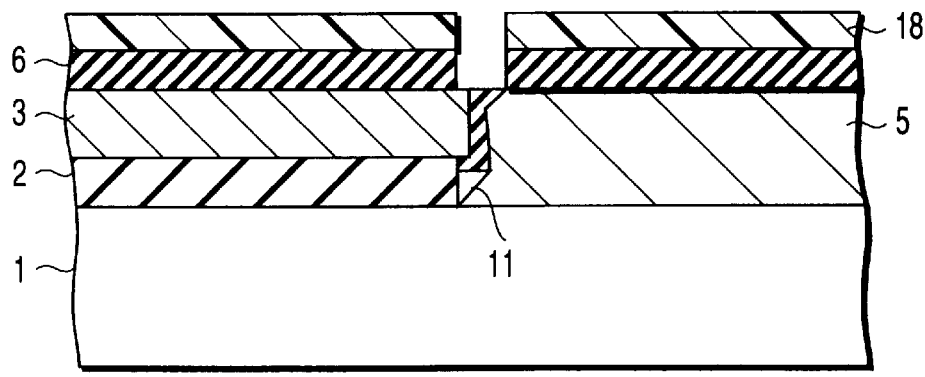

Next, a region other than a region which configures the STI region is covered with a photomask 18 (refer to FIG. 6E) and part of the silicon nitride layer 6 is removed (refer to FIG. 6F).

Figure 6G:
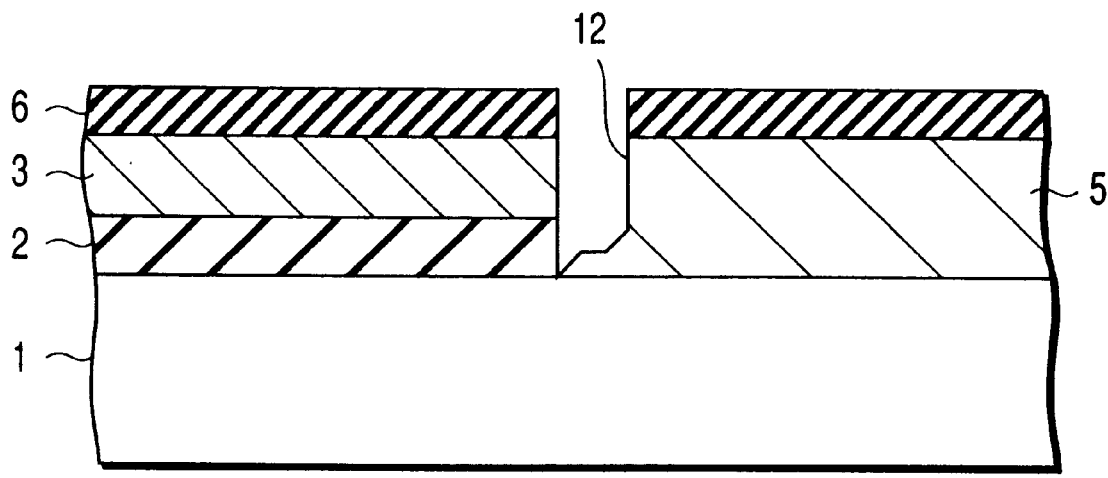

Then, as shown in FIG. 6G, portions of the protection film 4 (SiN), silicon layer 3, epitaxial silicon layer 5 (Si) and BOX layer 2 (SiO$_2$) which lie near the boundary portion between the SOI region and the non-SOI region are dry-etched by a method such as RIE in order to form an element isolation trench 12.

In the above etching process, the condition in which SiN, SiO$_2$ and Si can be etched at substantially the same etching rate is used. The depth of the trench 12 will vary with the etching time, but in any depth, it is possible to form the trench 12 in which the bottom surface thereof is coupled with the side surface thereof at an angle of 90° or more (obtuse angle 19A) at least on the non-SOI region side of the trench 12 by the presence of the facet 10 and cavity 11. Depending on the etching condition, a portion near the contact portion of the bottom surface of the trench 12 with the non-SOI region is formed to have a curved surface 19B. It is sufficient if the trench 12 is formed to such a depth as to reach at least the BOX layer 2 and the trench can be formed to extend into the silicon substrate 1.

Figure 6H:
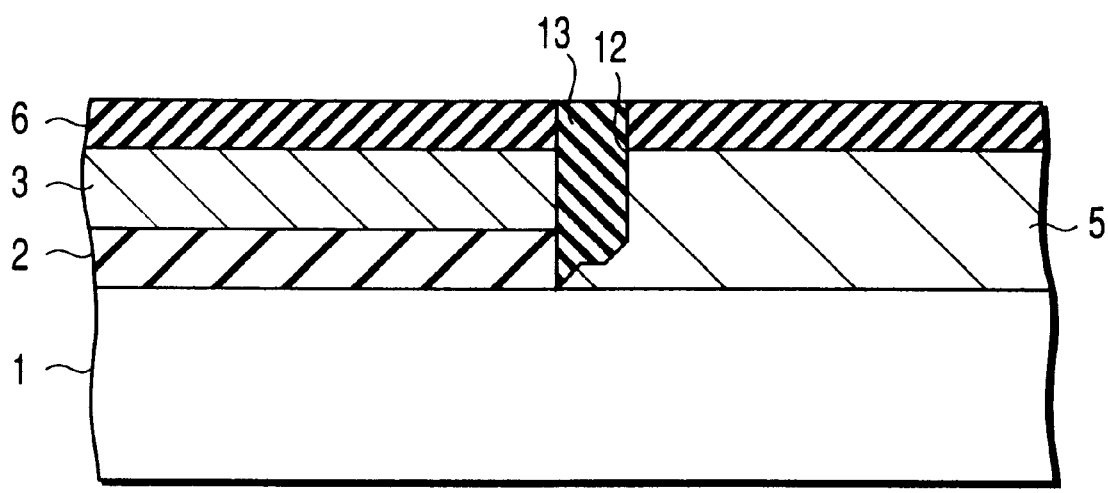

Next, as shown in FIG. 6H, an insulating layer for isolation 13 is filled or buried in the trench 12 to form an element isolation region of STI structure.

After this, the mask member 6 on the silicon layer and epitaxial silicon layer 5 is removed, and MOSFETs QA-1, QA-2, . . . configuring a logic circuit are formed in the silicon layer 3 and elements such as MOSFETs QB-1, QB-2, . . . configuring memory cells and sense amplifier circuit of a DRAM are formed in the epitaxial silicon layer 5 by use of a known process so as to form a semiconductor device as shown in FIG. 5A.

As explained in the first and second embodiments, the MOSFETs QA-1, QA-2, . . . and MOSFETs QB-1, QB-2, . . . can be formed in different steps or can be formed by commonly using part or all of the steps.

According to the above manufacturing method, since the lower end portion of the STI element isolation film 13 can be formed in smooth contact with the epitaxial silicon layer 5 by use of the facet 10 and cavity 11, entrance of crystal defects into the epitaxial silicon layer 5 by concentration of the stress in the boundary portion between the oxide film and silicon can be suppressed. As a result, since crystal defects are difficult to enter the non-SOI region, a partial SOI wafer of high quality can be provided. Further, since it is not necessary to form a contact region and a lead-out region from the body section of each MOSFET for controlling the body potential, the cell area and the area of the sense amplifier section will not increase. Therefore, a high speed and high performance semiconductor device and a manufacturing method thereof can be attained without losing the feature of high integration density when the partial SOI wafer is used.

In the second and third embodiments, the element isolation region is formed so as not to leave behind the cavity 11 when the element isolation region of STI structure is formed by burying or filling the isolation insulating layer 13 in the trench 12. However, as shown in FIGS. 7 and 8, even if the cavity 11 is left behind under the isolation insulating layer 13, the stress between the oxide film and silicon can be alleviated and the same effect and function can be attained.

Figure 7:
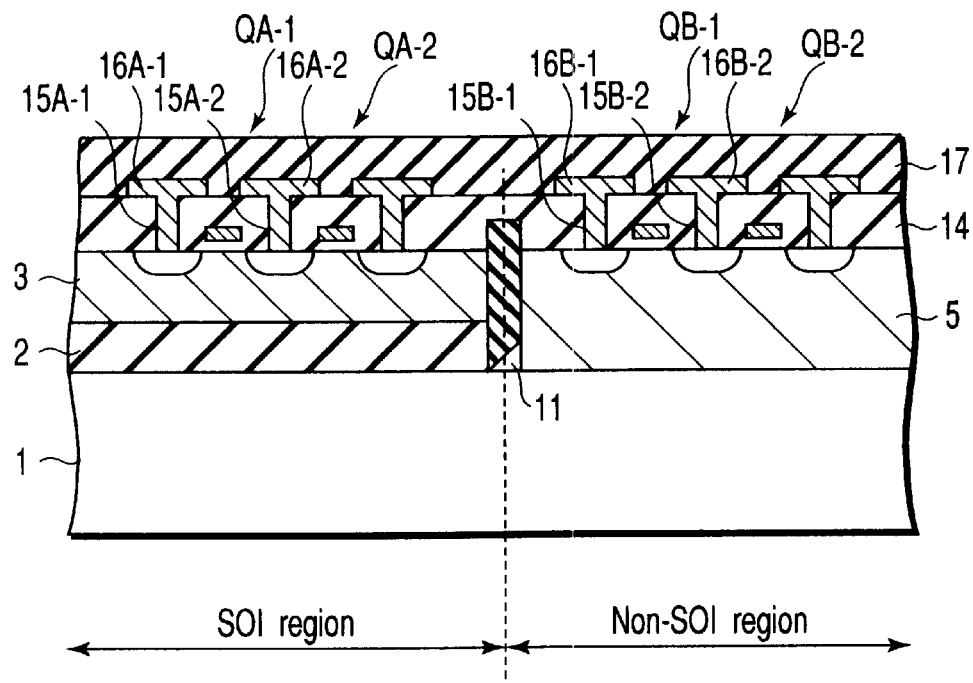
FIG. 7 is a cross sectional view showing an STI region in a boundary portion between an SOI region and a non-SOI region, for illustrating a modification of the semiconductor device according to the second embodiment of this invention.

FIG. 7 is a cross sectional view showing an STI region in a boundary portion between an SOI region and a non-SOI region, for illustrating a modification of the semiconductor device according to the second embodiment of this invention. As shown in FIG. 7, a cavity 11 is left behind under the isolation insulating layer 13.

Figure 8:
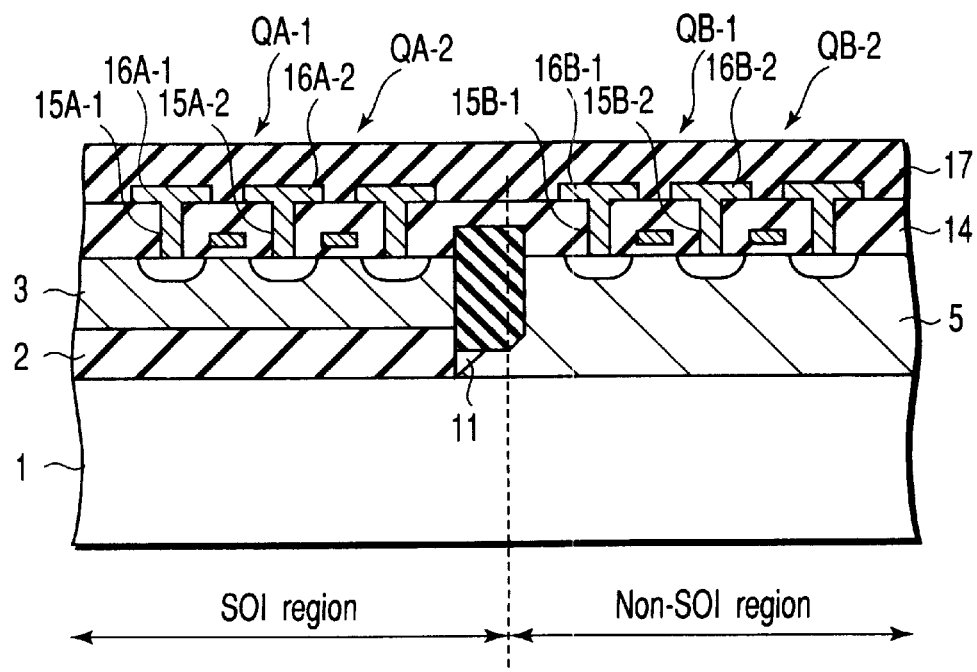
FIG. 8 is a cross sectional view showing an STI region in a boundary portion between an SOI region and a non-SOI region, for illustrating a modification of the semiconductor device according to the third embodiment of this invention.

FIG. 8 is a cross sectional view showing an STI region in a boundary portion between an SOI region and a non-SOI region, for illustrating a modification of the semiconductor device according to the third embodiment of this invention. As shown in FIG. 8, a cavity 11 is left behind under the isolation insulating layer 13.

Further, in the above embodiments, the epitaxial silicon layer 5 is formed on the silicon substrate 1 in the non-SOI region and elements such as MOSFETs are formed in the epitaxial silicon layer 5, but it is also possible to form the elements in a bulk, that is, in the silicon substrate 1.

As described above, according to one aspect of this invention, a manufacturing method of a partial SOI wafer of high quality in which crystal defects are difficult to enter the non-SOI region can be attained.

Further, a high speed and high performance semiconductor device and a manufacturing method thereof can be attained without losing the feature of high integration density when the partial SOI wafer is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first semiconductor region having a buried oxide layer formed therein,
   a second semiconductor region in which the buried oxide layer does not exist,
   a trench formed to a depth to reach at least the buried oxide layer in a boundary portion between said first and second semiconductor regions, and
   an insulating layer for isolation buried in said trench,
   wherein an angle made by the bottom surface of said isolation insulating layer with the side surface of said second semiconductor region is an obtuse angle.

2. The semiconductor device according to claim 1, wherein an angle made by the bottom surface of a portion of said isolation insulating layer which lies near said first semiconductor region with the side surface of said first semiconductor region is different from an angle made by the bottom surface of a portion of said isolation insulating layer which lies near said second semiconductor region with the side surface of said second semiconductor region.

3. The semiconductor device according to claim 1, wherein said second semiconductor region is an epitaxial silicon layer and has a facet on a boundary portion thereof with the bottom surface of said isolation insulating layer.

4. The semiconductor device according to claim 1, wherein a cavity is formed in said second semiconductor region in a boundary portion between said isolation insulating layer and said second semiconductor region.

5. The semiconductor device according to claim 1, wherein said first semiconductor region is an SOI region and said second semiconductor region is a non-SOI region.

6. The semiconductor device according to claim 1, further comprising first elements formed in said first semiconductor region and second elements formed in said second semiconductor region.

7. The semiconductor device according to claim 6, wherein said first elements are elements configuring a logic circuit and said second elements are elements configuring memory cells.

8. A semiconductor device comprising:
   a first semiconductor region having a buried oxide layer formed therein,
   a second semiconductor region in which the buried oxide layer does not exist,
   a trench formed to a depth to reach at least the buried oxide layer in a boundary portion between said first and second semiconductor regions, and
   an insulating layer for isolation buried in said trench,
   wherein a portion near a contact portion of the bottom surface of said isolation insulating layer with said second semiconductor region has a curved surface.

9. The semiconductor device according to claim 8, wherein an angle made by the bottom surface of a portion of said isolation insulating layer which lies near said first semiconductor region with the side surface of said first semiconductor region is different from an angle made by the bottom surface of a portion of said isolation insulating layer which lies near said second semiconductor region with the side surface of said second semiconductor region.

10. The semiconductor device according to claim 8, wherein said second semiconductor region is an epitaxial silicon layer and has a facet on a boundary portion thereof with the bottom surface of said isolation insulating layer.

11. The semiconductor device according to claim 8, wherein a cavity is formed in said second semiconductor region in a boundary portion between said isolation insulating layer and said second semiconductor region.

12. The semiconductor device according to claim 8, wherein said first semiconductor region is an SOI region and said second semiconductor region is a non-SOI region.

13. The semiconductor device according to claim 8, further comprising first elements formed in said first semiconductor region and second elements formed in said second semiconductor region.

14. The semiconductor device according to claim 13, wherein said first elements are elements configuring a logic circuit and said second elements are elements configuring memory cells.

* * * * *